United States Patent
Chen et al.

(10) Patent No.: US 8,178,434 B2
(45) Date of Patent: May 15, 2012

(54) ON-CHIP EMBEDDED THERMAL ANTENNA FOR CHIP COOLING

(75) Inventors: Fen Chen, Williston, VT (US); Jeffrey P. Gambino, Westford, VT (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/244,998

(22) Filed: Sep. 26, 2011

(65) Prior Publication Data

US 2012/0015511 A1  Jan. 19, 2012

Related U.S. Application Data

(62) Division of application No. 12/420,157, filed on Apr. 8, 2009, now Pat. No. 8,053,814.

(51) Int. Cl.
*H01L 21/768* (2006.01)
(52) U.S. Cl. .................. 438/599; 257/E21.575
(58) Field of Classification Search .............. 438/588, 438/598, 599
See application file for complete search history.

(56) References Cited

U.S. PATENT DOCUMENTS

| 4,716,308 | A | 12/1987 | Matsuo et al. |
| 5,955,781 | A | 9/1999 | Joshi et al. |
| 6,100,199 | A | 8/2000 | Joshi et al. |
| 6,281,049 | B1 * | 8/2001 | Lee ............ 438/129 |
| 6,333,557 | B1 | 12/2001 | Sullivan |
| 6,512,292 | B1 | 1/2003 | Armbrust et al. |
| 6,773,952 | B2 | 8/2004 | Armbrust et al. |
| 6,894,392 | B1 * | 5/2005 | Gudesen et al. ...... 257/759 |
| 7,157,365 | B2 * | 1/2007 | Ryan ............ 438/622 |

OTHER PUBLICATIONS

Office Action Communication, U.S. Appl. No. 12/420,157, dated Mar. 9, 2011, pp. 1-10.
Notice of Allowance and Fees Due Communication, U.S. Appl. No. 12/420,157, dated Jul. 18, 2011, pp. 1-9.

* cited by examiner

*Primary Examiner* — Chandra Chaudhari
(74) *Attorney, Agent, or Firm* — Gibb I.P. Law Firm, LLC; Richard M. Kotulak, Esq.

(57) ABSTRACT

An apparatus comprises a first layer within a semiconductor chip having active structures electrically connected to other active structures and having electrically isolated first inactive structures. A second layer within the semiconductor chip is physically connected to the first layer. The second layer comprises an insulator and has second inactive structures. The first inactive structures are physically aligned with the second inactive structures.

15 Claims, 4 Drawing Sheets

ON-CHIP EMBEDDED THERMAL ANTENNA FOR CHIP COOLING

CROSS-REFERENCE TO RELATED APPLICATIONS

This application is a divisional of U.S. application Ser. No. 12/420,157, filed Apr. 8, 2009, now U.S. Pat. No. 8,053,814, Issued Nov. 8, 2011, the complete disclosure of which, in its entirety, is herein incorporated by reference.

BACKGROUND

1. Field of the Invention

The embodiments of the invention generally relate to semiconductor chips and, more specifically, to semiconductor chips that include inactive devices that are aligned with each other to form a thermal path through the layers of the semiconductor chip and potentially through the entire semiconductor chip.

2. Description of the Related Art

Low dielectric constant materials (low-k dielectric materials) in multilevel very large scale integration (VLSI) circuits significantly decrease heat transfer. This inhibits heat generated by active devices from being able to travel through the back end metallurgies of a semiconductor chip to a heat sink at the top of the chip. Such low-K dielectric materials also impact dissipating heat generated by the integrated circuit wires themselves. This problem is complicated further by stacked chip effort of today's advanced devices. The joule heating of interconnect wires and vias can also be a major thermal source that needs to be addressed.

Hence, there is a need for a cooling solution that efficiently removes significant heat from the interconnect levels of a semiconductor chip, and that transfers heat through the interconnect levels without significant area penalties. This is all the more crucial today with the plans for stacked chips.

SUMMARY

Embodiments herein include a method of creating an integrated circuit chip (and potentially a stack of integrated circuit chips). The method forms a first layer of a semiconductor chip and then patterns active structures within the first layer. The "active structures" comprise integrated circuit structures that switch from one electrical state to another electrical state to perform logical or storage operations and are, for example, transistors, capacitors, diodes, etc. In addition, the method patterns wiring between the active structures within the first layer to electrically connect the active structures to contacts and other active structures.

While forming the active structures, the method also simultaneously patterns first inactive structures (using a first pattern) within locations of the first layer that are electrically isolated from other structures within the first layer. These inactive (or "dummy") structures are generally used to balance various manufacturing and operational characteristics. For example, many times inactive structures are formed so that polishing processes will occur evenly throughout the given layer. Inactive structures are electrically isolated from any other structures within the semiconductor chip (formed completely within an electrical insulator).

In a multilayer semiconductor chip, the active layers are separated from one another using electrically insulating layers (that may contain wiring or other connections), that are sometimes referred to as interlayer dielectric (ILD) layers. Therefore, the method forms such a second insulating layer within the semiconductor chip physically connected to the first layer. In addition, the method patterns second inactive structures (that are thermally conductive) within the second layer using the first pattern and within locations of the second layer that correspond to the first inactive structures. This causes the first inactive structures to be physically aligned with the second inactive structures and form a thermally conductive path through both layers.

In addition, the method continues the process of forming the multilayer semiconductor chip, layer by layer. Therefore, the method forms additional first layers, and forms additional second layers between the additional first layers to create the multi-layer semiconductor chip. The patterning of the first inactive structures and the patterning of the second inactive structures is performed such that the first inactive structures have a pattern, a pitch, and physical locations within the first layer matching a pattern, a pitch, and physical locations of the second inactive structures within the second layer. In such a semiconductor chip all of the first inactive structures are physically aligned (top to bottom) with all of the second inactive structures and the first inactive structures and the second inactive structures form a continuous thermally conductive path through the semiconductor chip.

The method can also a form and attach one or more additional semiconductor chips on top of such a semiconductor chip. The additional semiconductor chips can also include aligned thermal conductors that help dissipate heat through all the stacked chips.

This process produces a multi-layer semiconductor chip structure that includes at least one of the first layers. Again, the first layers have active structures electrically connected to other active structures and have electrically isolated first inactive structures. Further, the structure also includes at least one of the second layers. Similarly, each of the second layers is physically connected to at least one of the first layers (top, bottom, or both).

As described above, the second layers comprise an inter layer dielectric insulator and have second inactive structures. The first inactive structures and the second inactive structures comprise thermal conductors. All of the first inactive structures are physically aligned with one the second inactive structures. Thus, the first inactive structures have a pattern, a pitch, and physical locations within the first layers that match the pattern, the pitch, and physical locations of the second inactive structures within the second layers.

In some embodiments, the first inactive structures can be physically connected to the second inactive structures. In other embodiments, the first inactive structures are separated from the second inactive structures only by liners or other relatively small portions of material that do not greatly inhibit thermal conductivity between the inactive structures. With the embodiments herein, the first inactive structures and the second inactive structures form a continuous thermally conductive path through the semiconductor chip.

In some embodiments, the first inactive structures comprise a thermally conductive metal and the second inactive structures comprise a thermally conductive electrical insulator. For example, the first inactive structures can comprise any common conductor metal (whether currently known or developed in the future) including aluminum, copper, titanium, tungsten, gold, tantalum, tantalum nitride, chromium, etc. The second inactive structures comprise any thermally conductive electrical insulator (one are currently known or developed in the future) such as silicon carbide, silicon nitride, etc.

BRIEF DESCRIPTION OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, the use of low-K dielectrics has increased the difficulty of transferring and dissipating heat generated by the active structures and wiring within an integrated circuit chip. Inactive ("dummy") metallic fill structures are commonly used to minimize the topographical variation for polishing processes (chemical mechanical polishing CMP). Because such inactive structures are electrically and thermally conductive, they tend to increase the thermal conductivity of the structure, but it also increases the electrical noise within the chip. In other words, even though the inactive structures are electrically isolated from the wiring and active structures within the integrated circuit chip, because they are formed from metal, they still tend to create interference and/or distort signals being transferred in the active structures and along the active wiring. This interference, distortion, and electrical noise is sometimes referred to as "crosstalk." Thus, within integrated circuit design there is a tradeoff between processing needs to have acceptable polishing, heat conduction, and electrical noise.

The embodiments herein maximize heat conductivity and minimize crosstalk by aligning inactive fill shapes in such a way as to ensure their direct thermal connection all the way from the top of the chip to the substrate. Once this optimal alignment of the fill shapes is done, any metal fill not necessary for the thermal connection or for CMP optimization can be eliminated, hence improving the crosstalk characteristics. Further, if dielectrics are used that do not require inactive fill shapes, then the aligned thermally conductive inactive fill structures disclosed herein could be introduced strictly for heat conductivity. By aligning the thermally conductive insulator fill structure patterns with the metal fill patterns, a certain amount (e.g., ⅔, etc.) of the metal can be removed from the metal fill patterns and still maintain the same thermal conductivity. Alternatively, if a higher crosstalk level is tolerable, the metal fill structures could be left in place, which would simply increase the thermal conductivity. This method allows for standard processing and does not require an analysis looking for hot spots.

Figure 1:
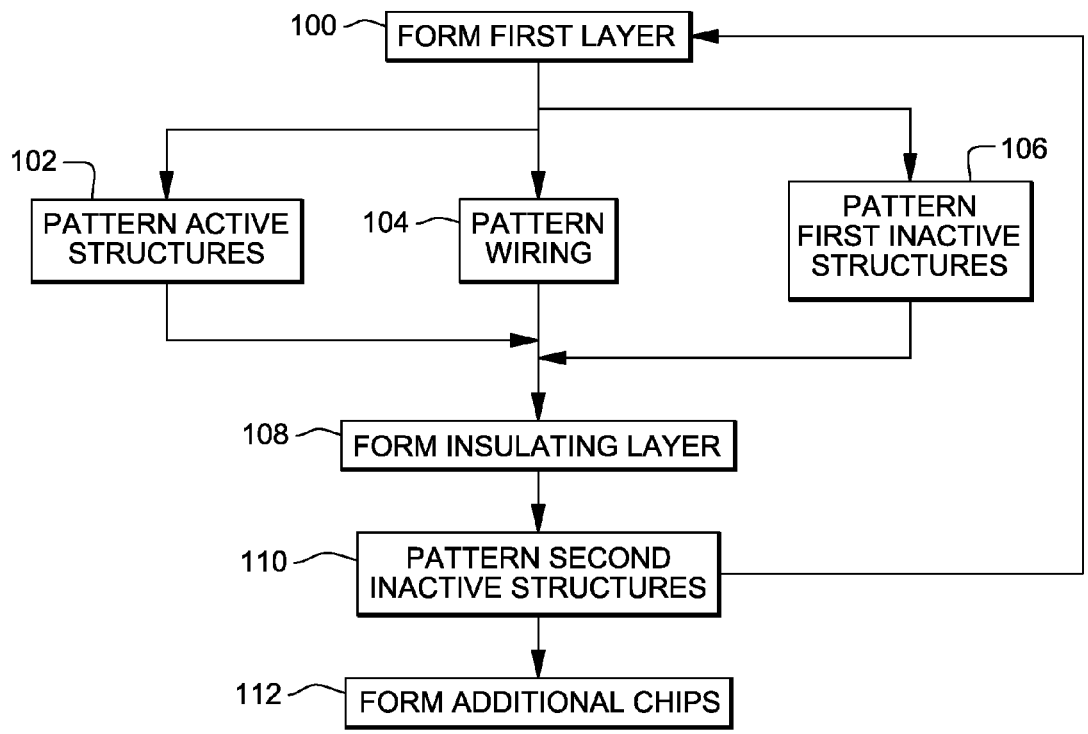
FIG. 1 is a flowchart illustrating embodiments herein.

As shown in flowchart form in FIG. 1, embodiments herein include a method of creating an integrated circuit chip (and potentially a stack of integrated circuit chips). The method begins by forming a first layer of a semiconductor chip (item 100) and then patterns active structures within the first layer (item 102). The "active structures" comprise integrated circuit structures that switch from one electrical state to another electrical state to perform logical or storage operations and are, for example, transistors, capacitors, diodes, etc. In addition, the method patterns wiring between the active structures within the first layer (item 104) to electrically connect the active structures to contacts and other active structures. The methods, materials, etc. used to manufacture transistors, etc. are well-known to those ordinarily skilled in the art, and a detailed discussion of the same is not included herein (see U.S. Patent Publication 2008/0272457 that is fully incorporated herein by reference)

While forming the active structures, the method also simultaneously patterns first inactive structures (using a first pattern) within locations of the first layer that are electrically isolated from other structures within the first layer (item 106). These inactive (or "dummy") structures are generally used to balance various manufacturing and operational characteristics. For example, many times inactive structures are formed so that polishing processes will occur evenly throughout the given layer. Inactive structures are electrically isolated from any other structures within the semiconductor chip (formed completely within an electrical insulator). The methods, materials, etc. used to manufacture such inactive structures are well-known to those ordinarily skilled in the art, and a detailed discussion of the same is not included herein (see U.S. Patent Publication 2009/0032956 that is fully incorporated herein by reference).

In a multilayer semiconductor chip, the active layers are separated from one another using insulator layers (that may contain wiring, conductive vias, etc.) which are sometimes referred to as interlayer dielectric (ILD) layers. Therefore, the method forms such a second insulating layer within the semiconductor chip physically connected to the first layer (item 108). In addition, the method patterns second inactive structures (that are thermally conductive) within the second layer (using the first pattern) within locations of the second layer that correspond to the first inactive structures (item 110). This causes the first inactive structures (item 110) to be physically aligned with the second inactive structures and forms a thermally conductive path through both layers.

Any conventionally known methods (or methods developed in the future) can be utilized to form the inactive structures (item 110). For example, a pattern of openings can be formed within the insulating layer (using masking and selective etching techniques) and the inactive structures (item 110) can be deposited or grown in the openings. Alternatively, the inactive structures (item 110) can be patterned on the underlying layer (using masking and selective etching techniques) and an insulating layer (item 108) can be formed over such structures. In addition, other well-known methodologies can be used to form such inactive structures within the insulating layer.

In addition, the method continues the process of forming the multilayer semiconductor chip, layer by layer by repeating the foregoing processes as indicated by the arrow in the flow chart. Therefore, the method forms additional first layers, and forms additional second layers between the additional first layers to create the multi-layer semiconductor chip.

The patterning of the first inactive structures (item 106) and the patterning of the second inactive structures (item 110) is performed such that the first inactive structures have a pattern, a pitch, and physical locations within the first layer matching a pattern, a pitch, and physical locations of the second inactive structures within the second layer. In such a semiconductor chip, all of the first inactive structures are physically aligned (top to bottom) with all of the second inactive structures and the first inactive structures and the second inactive structures form a continuous thermally conductive path through the semiconductor chip.

The method can also a form and attach one or more additional semiconductor chips on top of such a semiconductor chip (item 112). The additional semiconductor chips can also include aligned thermal conductors that help dissipate heat through all the stacked chips.

Figure 2:
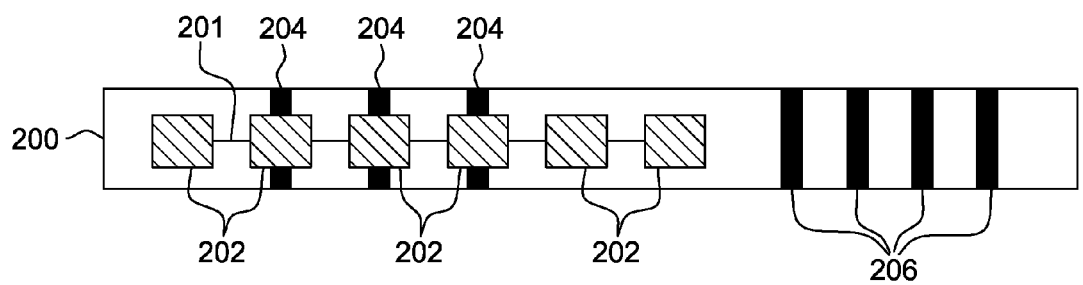
FIG. 2 is a cross-sectional schematic diagram of a partially completed integrated circuit chip according to embodiments herein.

As shown in FIGS. 2-7, this process produces a multi-layer semiconductor chip structure that includes at least one of the first layers 200. As shown in FIG. 2, the first layers 200 have active structures 202 electrically connected to other active structures 202 by wires 201. The electrically isolated first inactive structures are shown as item 206. Some of the active structures 202 include contacts 204 that will electrically connect the active structures 202 to other structures in other layers of the semiconductor chip (or potentially to structures outside the semiconductor chip).

As mentioned above, the structure includes at least one of the second layers 208 that is formed over a first layer 200. As described above, the second layers 208 comprise an inter layer dielectric insulator and are used to electrically isolate each of the first layers 200 (except in locations where electrical connections are desired, and where conductive vias 212 are formed). Therefore, each of the second layers 208 is positioned between the first layers and is physically connected to at least one of the first layers 200 (top, bottom, or both) and includes conductive vias 212 that connect selected active structures 202 to other layers of the semiconductor structure, or to structures outside the semiconductor structure. The conductive vias 212 can comprise any form of conductor, including polysilicon, metals, alloys, or any other suitable conductor, whether now known or developed in the future.

As described above, the second layers 208 have second inactive structures 210. The first inactive structures 206 and the second inactive structures 210 comprise thermal conductors. All of the first inactive structures 206 are physically aligned with one the second inactive structures 210. Thus, the first inactive structures 206 have a pattern, a pitch, and physical locations within the first layers 200 that match the pattern, the pitch, and physical locations of the second inactive structures 210 within the second layers 208.

In some embodiments, the first inactive structures 206 can be physically connected to the second inactive structures 210. In other embodiments, the first inactive structures 206 are separated from the second inactive structures 210 only by liners or other relatively small portions of material that do not greatly inhibit thermal conductivity between the inactive structures. With the embodiments herein, the first inactive structures 206 and the second inactive structures 210 form a continuous thermally conductive path through the semiconductor chip.

Figure 3:
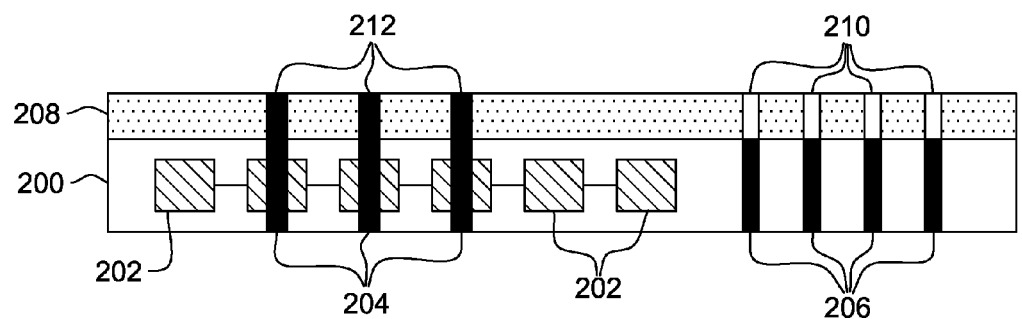
FIG. 3 is a cross-sectional schematic diagram of a partially completed integrated circuit chip according to embodiments herein.
Figure 4:
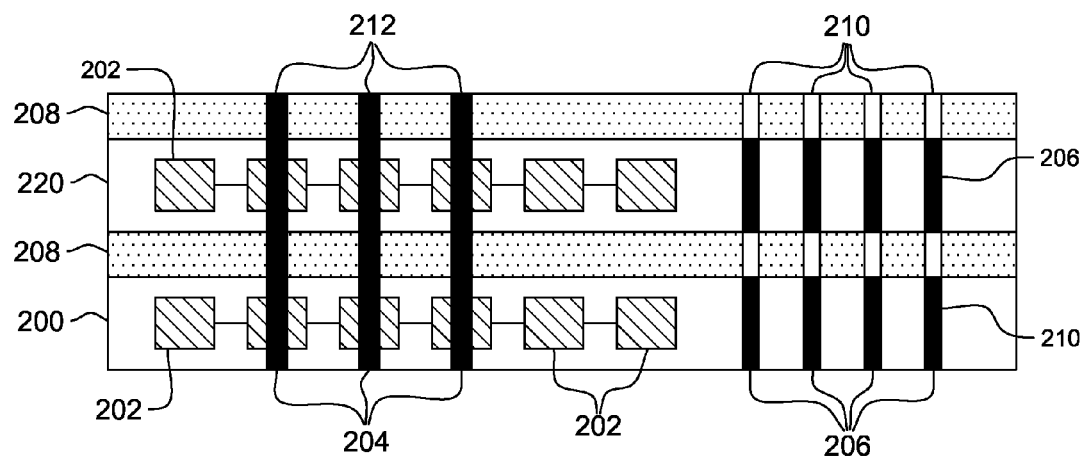
FIG. 4 is a cross-sectional schematic diagram of a partially completed integrated circuit chip according to embodiments herein.

In the embodiments shown in FIGS. 3-4, the first inactive structures 206 comprise a thermally conductive metal and the second inactive structures 210 comprise a thermally conductive, electrical insulator. For example, the first inactive structures 206 can comprise any common conductor metal (whether currently known or developed in the future) including aluminum, copper, titanium, tungsten, gold, tantalum, tantalum nitride, chromium, etc. The second inactive structures 210 comprise any thermally conductive electrical insulator (whether currently known or developed in the future) such as silicon carbide, silicon nitride (e.g., diamond, etc.). The second inactive structures 210 can comprise well-known electrical insulator that are thermally conductive (such as those mentioned) or can comprise any esoteric material (e.g., diamond, etc.) that is an electrical insulator that has good thermal conductivity, whether now known or developed in the future.

FIG. 4 illustrates additional first and second layers (200/208) that are formed, as described above. While only four layers are illustrated in FIG. 4, those ordinarily skilled in the art would understand that most semiconductor chips include many more pairs of layers and that only two pairs of layers (four layers) are illustrated to maintain simplicity within the drawings.

Figure 5:
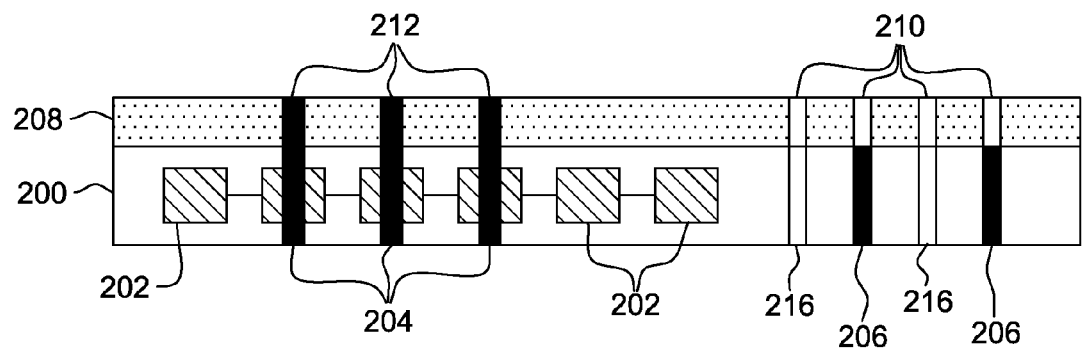
FIG. 5 is a cross-sectional schematic diagram of a partially completed integrated circuit chip according to embodiments herein.

Utilization of aligned thermal conductors within the active layers and inter dielectric layers increases the thermal performance of the semiconductor chip. The thermally conductive electrical insulators 210 are less thermally conductive than the electrical conductors 206. However, because of the increased thermal performance provided by aligning all the thermal conductors within the chip, some of the first inactive structures 206 can be replaced with thermally conductive electrical insulators 216 as shown in FIG. 5. By reducing the number of inactive structures 206 within the active layer 200 of the semiconductor chip, crosstalk can be reduced substantially.

Figure 6:
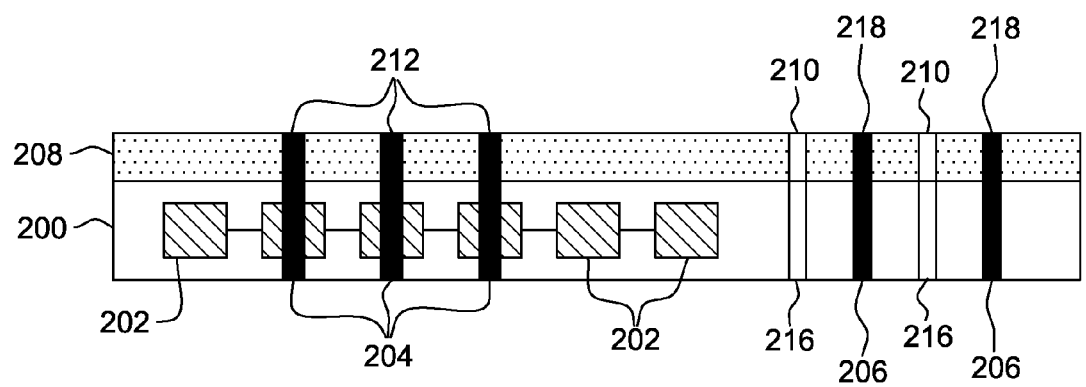
FIG. 6 is a cross-sectional schematic diagram of a partially completed integrated circuit chip according to embodiments herein.

Similarly, in order to increase thermal performance, some of the thermally conductive electrical insulators 210 can be replaced with electrical conductors 218, as shown in FIG. 6. In such embodiments, the electrical path of the first inactive structure 206 and second inactive structure 218 is interrupted by at least one thermally conductive electrical insulator to avoid making an unintentional electrically conductive path through the semiconductor chip (to avoid forming an electrically conductive path all the way from the bottom of the semiconductor chip to the top of the semiconductor chip).

Figure 7:
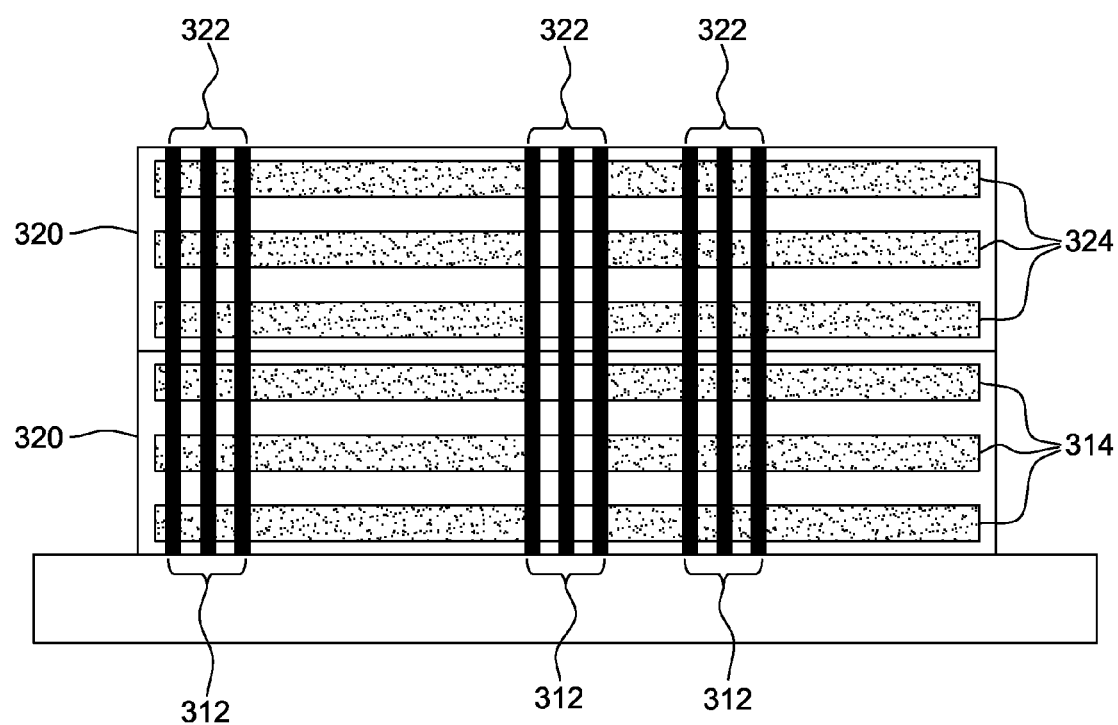
FIG. 7 is a cross-sectional schematic diagram of a stacked integrated circuit chips according to embodiments herein.

As also mentioned above, once the semiconductor chip has been produced, multiple chips can be stacked upon one another. Therefore, as illustrated in FIG. 7, a first chip 310 can be mounted on a substrate 300 and a second chip 320 can be mounted on the first chip 310. Each of the chips includes multiple layers 314, 324. Any of the layers 314, 324 can represent any of the active layers (200) or inter layer dielectric layers (208) that are discussed above. Items 312 represent the combined first and second inactive structures (206/210) that are discussed above. Items 314 similarly illustrate the combined inactive structures in the second chip 320. As illustrated in FIG. 7, the first and second inactive structures 312/324 can be aligned to provide a thermally conductive path through multiple stacked chips that is not electrically conductive.

The resulting integrated circuit chip can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A method comprising:
   patterning active structures within a first layer of a semiconductor chip;
   patterning wiring between said active structures within said first layer;
   patterning first inactive structures using a first pattern within locations of said first layer that are electrically isolated from other structures within said first layer;
   forming a second layer within said semiconductor chip physically connected to said first layer, said second layer comprising an insulator; and
   patterning second inactive structures within said second layer using said first pattern and within locations of said second layer that correspond to said first inactive structures such that said first inactive structures are physically aligned with said second inactive structures.

2. The method according to claim 1, said first inactive structures comprising any thermally conductive metal and said second inactive structures comprising any thermally conductive insulator.

3. The method according to claim 1, said first inactive structures comprising at least one of aluminum, copper, titanium, tungsten, gold, tantalum, tantalum nitride, chromium and said second inactive structures comprising at least one of silicon carbide, silicon nitride, and diamond.

4. The method according to claim 1, said patterning of said first inactive structures and said patterning of said second inactive structures being performed such that said first inactive structures have a pattern, a pitch, and physical locations within said first layer matching a pattern, a pitch, and physical locations of said second inactive structures within said second layer.

5. The method according to claim 1, said active structures comprising integrated circuit structures that switch from one electrical state to another electrical state to perform one of logical operations and storage operations and comprise at least transistors, capacitors, and diodes.

6. A method comprising:
   forming a first layer of a semiconductor chip;
   patterning active structures within said first layer;
   patterning wiring between said active structures within said first layer;
   patterning first inactive structures using a first pattern within locations of said first layer that are electrically isolated from other structures within said first layer;
   forming a second layer within said semiconductor chip physically connected to said first layer, said second layer comprising an insulator;
   patterning second inactive structures within said second layer using said first pattern and within locations of said second layer that correspond to said first inactive structures such that said first inactive structures are physically aligned with said second inactive structures;
   forming additional first layers and additional second layers between said additional first layers to create a multi-layer semiconductor chip where all of said first inactive structures are physically aligned with all of said second inactive structures and said first inactive structures and said second inactive structures form a continuous thermally conductive path through said semiconductor chip.

7. The method according to claim 6, said first inactive structures comprising any thermally conductive metal and said second inactive structures comprising any thermally conductive electrical insulator.

8. The method according to claim 6, said first inactive structures comprising at least one of aluminum copper, titanium, tungsten, gold, tantalum, tantalum nitride, chromium and said second inactive structures comprising at least one of silicon carbide, silicon nitride, and diamond.

9. The method according to claim 6, said patterning of said first inactive structures and said patterning of said second inactive structures being performed such that said first inactive structures have a pattern, a pitch, and physical locations within said first layer matching a pattern, a pitch, and physical locations of said second inactive structures within said second layer.

10. The method according to claim 6, said active structures comprising integrated circuit structures that switch from one electrical state to another electrical state to perform one of logical operations and storage operations and comprise at least transistors, capacitors, and diodes.

11. A method comprising:
    patterning active structures within a first layer of a semiconductor chip;
    patterning wiring between said active structures within said first layer;
    patterning first inactive structures using a first pattern within locations of said first layer that are electrically isolated from other structures within said first layer;
    forming a second layer within said semiconductor chip physically connected to said first layer, said second layer comprising an insulator; and
    patterning second inactive structures within said second layer using said first pattern and within locations of said second layer that correspond to said first inactive structures such that said first inactive structures are physically aligned with said second inactive structures, said second inactive structures comprising any thermally conductive insulator.

12. The method according to claim 11, said first inactive structures comprising any thermally conductive metal.

13. The method according to claim 11, said first inactive structures comprising at least one of aluminum, copper, titanium, tungsten, gold, tantalum, tantalum nitride, chromium and said second inactive structures comprising at least one of silicon carbide, silicon nitride, and diamond.

14. The method according to claim 11, said patterning of said first inactive structures and said patterning of said second inactive structures being performed such that said first inactive structures have a pattern, a pitch, and physical locations within said first layer matching a pattern, a pitch, and physical locations of said second inactive structures within said second layer.

15. The method according to claim 11, said active structures comprising integrated circuit structures that switch from one electrical state to another electrical state to perform one of logical operations and storage operations and comprise at least transistors, capacitors, and diodes.

* * * * *